(12) United States Patent
Lv et al.

(10) Patent No.: US 12,341,519 B2
(45) Date of Patent: Jun. 24, 2025

(54) FREQUENCY MULTIPLIER, SIGNAL TRANSMITTER AND RADAR CHIP

(71) Applicant: CALTERAH SEMICONDUCTOR TECHNOLOGY (SHANGHAI) CO., LTD., Shanghai (CN)

(72) Inventors: Wentao Lv, Shanghai (CN); Wenting Zhou, Shanghai (CN)

(73) Assignee: Calterah Semiconductor Technology (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 18/400,452

(22) Filed: Dec. 29, 2023

(65) Prior Publication Data

US 2024/0137013 A1   Apr. 25, 2024
US 2024/0235535 A9   Jul. 11, 2024

Related U.S. Application Data

(63) Continuation of application No. PCT/CN2023/102467, filed on Jun. 26, 2023.

(30) Foreign Application Priority Data

Sep. 6, 2022   (CN) .......................... 202211085204.0

(51) Int. Cl.
  *H03H 11/04*   (2006.01)
  *H03K 5/00*   (2006.01)
  (Continued)

(52) U.S. Cl.
  CPC ......... *H03K 5/00006* (2013.01); *H03H 11/04* (2013.01); *H03K 17/56* (2013.01); *H03K 19/20* (2013.01); *H03H 2011/0488* (2013.01)

(58) Field of Classification Search
  CPC ..................... H03B 19/14; H03B 7/08; H03B 2200/0038; H04B 1/04; H04B 2001/0408;
  (Continued)

(56) References Cited

U.S. PATENT DOCUMENTS 6,369,622 B1   4/2002   Lim et al.
11,082,053 B1   8/2021   Yan
(Continued)

FOREIGN PATENT DOCUMENTS

CN   203881938 U   10/2014
CN   107710633 A   2/2018
(Continued)

OTHER PUBLICATIONS

EP Search Report for EP Application No. 23825592, dated Sep. 24, 2024.
(Continued)

*Primary Examiner* — John W Poos
(74) *Attorney, Agent, or Firm* — Foley & Lardner LLP

(57) ABSTRACT

Disclosed are a frequency multiplier, a signal transmitter and a radar chip. The frequency multiplier includes a signal generator that is configured to receive an FMCW signal and output a square wave signal at a frequency same as a frequency of the FMCW signal; and a third harmonic amplifier that is coupled to the signal generator and is configured to amplify a third harmonic wave in the square wave signal and output a frequency-tripled FMCW signal. The above-mentioned solution can improve the generation efficiency of the frequency-tripled signal.

17 Claims, 5 Drawing Sheets

(51) Int. Cl.
*H03K 17/56* (2006.01)
*H03K 19/20* (2006.01)

(58) Field of Classification Search
CPC .... H03K 5/00006; H03K 17/56; H03K 19/20; H03H 11/04; H03H 2011/0488; G01S 13/931; G01S 2013/9327; G01S 7/032; G01S 7/35; G01S 13/348; H03L 7/24
See application file for complete search history.

(56) References Cited

U.S. PATENT DOCUMENTS

| | | | |
|---|---|---|---|
| 2006/0050581 A1* | 3/2006 | Luk | H03F 3/347 365/205 |
| 2006/0261865 A1 | 11/2006 | Wetzel et al. | |
| 2008/0003954 A1 | 1/2008 | Matsuno | |
| 2023/0408670 A1* | 12/2023 | Tousi | G01S 13/288 |

FOREIGN PATENT DOCUMENTS

| | | | | |
|---|---|---|---|---|
| CN | 114710119 A | | 7/2022 | |
| DE | 102019107377 A1 | * | 9/2020 | ............. G01S 7/036 |
| EP | 1 110 303 B1 | | 6/2001 | |
| WO | WO-2005107059 A1 | * | 11/2005 | ............. H03B 19/00 |

OTHER PUBLICATIONS

Liang Chen et al., "A Monolithic Dual-Band 77/94 GHz Transceiver Front-End with Shared Frequency Multiplier," IEEE Access, vol. 7, Dec. 17, 2019.

Zhou Wen et al., "An E-Band Phase Modulated Pulse Radar SoC with An Analog Correlator", 2022 IEEE Radio Frequency Integrated Circuits Symposium (RFIC), IDDD, Jun. 19, 2022, pp. 127-130.

* cited by examiner

FREQUENCY MULTIPLIER, SIGNAL TRANSMITTER AND RADAR CHIP

CROSS-REFERENCE TO RELATED APPLICATION(S)

The present application is a continuation of International PCT Application No. PCT/CN2023/102467 filed Jun. 26, 2023, which claims the priority of the Chinese patent application No. 202211085204.0, filed on Sep. 6, 2022, which are incorporated herein by reference in their entities.

TECHNICAL FIELD

Embodiments of the present application relate to a field of electronic circuits, in particular to a frequency multiplier, a signal transmitter and a radar chip.

BACKGROUND

A frequency multiplier is a circuit of which an output signal has a frequency equal to an integer multiple of a frequency of an input signal. When a frequency-tripled signal is generated, an oscillator may be used to generate oscillation near the tripled frequency, then a third harmonic signal may be generated by using a nonlinear characteristic of an amplifier, and the third harmonic signal is used to perform injection-locking on the oscillator, so as to output a frequency-tripled signal with a higher power.

The above-mentioned implementation makes a design of a frequency-tripled module more complicated, leading to many risks, such as: as the Process, Voltage and Temperature (PVT for short) change, the oscillator may not start oscillating, or an offset may occur on an oscillation frequency of the oscillator and the injection-locking cannot be achieved. In addition, in order to obtain a large injection Locking Range (LR for short), a power of a frequency-tripled signal to be injected should not be too low, which may make a nonlinear amplifier generating a third harmonic wave consumes more power.

SUMMARY

In order to solve any of the above-mentioned technical problems, embodiments of the present application provide a frequency multiplier, a signal transmitter and a radar chip.

In order to achieve the purpose of the embodiments of the present application, a frequency multiplier is provided in an embodiment of the present application, including: a signal generator, configured to receive a Frequency-Modulated Continuous Wave (FMCW) signal and output a square wave signal at a frequency same as a frequency of the FMCW signal; and a third harmonic amplifier, coupled to the signal generator and is configured to amplify a third harmonic wave in the square wave signal and output a frequency-tripled FMCW signal.

A signal transmitter includes: an FMCW signal generator, a frequency multiplier circuit including the frequency multiplier, and a power amplifier.

The FMCW signal generator is configured to generate an FMCW signal under control of a frequency division adjustment signal.

The frequency multiplier circuit is coupled to the FMCW signal generator, and is configured to convert a frequency of the FMCW signal into a radio frequency FMCW signal in a millimeter wave frequency band by using the frequency multiplier.

The power amplifier is coupled with the frequency multiplier circuit, and is configured to perform power amplification on the radio frequency FMCW signal and output a radio frequency transmitted signal.

A radar chip includes: a transmitting antenna, configured to convert a received radio frequency FMCW signal into a detection signal wave, to radiate to a free space; a receiving antenna, configured to convert an echo signal wave into a radio frequency received signal, wherein the detection signal wave is reflected by an object to form the echo signal wave; a signal transmitter, connected with the transmitting antenna, and configured to feed a generated radio frequency FMCW signal to the transmitting antenna; and a signal receiver, connected with the receiving antenna, and configured to process the radio frequency received signal into a baseband digital signal using the radio frequency transmitted signal, and output it.

The technical solutions have the following advantages or beneficial effects: the square wave signal corresponding to the FMCW signal is generated by the signal generator, and the third harmonic component in the square wave signal is amplified by the third harmonic amplifier to obtain the frequency-tripled FMCW signal, thereby achieving the purpose of generating a high-frequency signal; compared with the third harmonic component generated by an oscillator in the related art, the third harmonic component in the square wave signal has a higher proportion, so that more third harmonic component is extracted by the third harmonic amplifier, and the generation efficiency of the frequency-tripled FMCW signal is improved.

Other features and advantages of embodiments of the present application will be set forth in the description below, and in part will become apparent from the specification, or may be learned by practice the embodiments of the present application. Purposes and other advantages of the embodiments of the present application can be achieved and obtained by structures specifically pointed out in the specification, claims and drawings.

BRIEF DESCRIPTION OF THE DRAWINGS

Accompanying drawings are used to provide a further understanding of technical solutions of the embodiments of the present application, form a part of the specification, and are used to explain the technical solutions of the embodiments of the present application together with the embodiments of the present application and are not intended to form limitations on the technical solutions of the embodiments of the present application.

DETAILED DESCRIPTION

Figure 1:
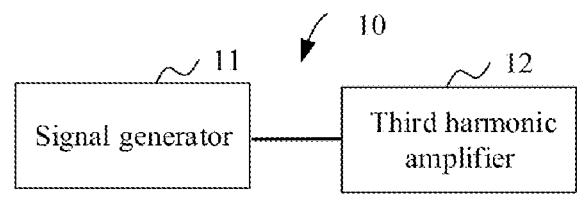
FIG. 1 is a schematic diagram of a structure of a frequency multiplier provided in an embodiment of the present application.

In order to make purposes, technical solutions and advantages of the embodiments of the present application clearer, the embodiments of the present application will be described in detail below with reference to the accompanying drawings. It should be noted that, without a conflict, the embodiments of the present application and the features in the embodiments can be combined with each other arbitrarily.

In a radar system, a frequency multiplier is configured to multiply a frequency band of a Frequency-Modulated Continuous Wave (FMCW for short) generated by a phase-locked loop to a radio frequency band such as a millimeter wave. As mentioned in the background, due to various limitations on injection locking of the frequency multiplier, the radar systems usually take a frequency band of a radiated electromagnetic wave as a target frequency band. The higher the frequency of frequency-modulated continuous wave generated by the phase-locked loop, the lower a multiple needed to be increased by the frequency multiplier, thus reducing design difficulty of the frequency multiplier. However, the higher the frequency of the frequency-modulated continuous wave generated by the phase-locked loop, the more difficult it is to suppress a phase noise of the FMCW signal. A larger phase noise causes missing detection, error detection and the like of the radar system due to the noise when the radar system uses the echo signal to perform target detection.

In order to systematically solve multiple technical difficulties such as phase noise suppression and injection locking in the above related technologies, the embodiments of the present application provides the following solutions, so as to achieve the purpose of frequency multiplying by separating a higher order harmonics contained in the oscillation signal. At the same time, considering that the FMCW signal is a signal with continuous varied frequencies in a frequency band, the frequency multiplier has characteristics of stable operation in the bandwidth for higher order harmonics in a corresponding frequency band.

If frequency tripling is performed on the FMCW signal by the above-mentioned frequency multiplier, as long as a frequency of the FMCW signal may be below 30 GHz, for example, not higher than 25 GHz. The frequency of the FMCW signal may be lower than 11 GHz or even lower than 10 GHz if a frequency-tripling circuit and other frequency multiplier circuits (such as a frequency doubling circuit) in the above-mentioned frequency multipliers are cascaded and combined to achieve higher frequency multiple processing. Since at least a part of the frequency multiplier circuit in the frequency multiplier provided in this solution does not adopt an injection locking solution, problems caused by the injection locking are suppressed. Since the frequency multiplier can provide high frequency multiplying conversion of the FMCW signal, an undesired situation such as phase noise caused by a high frequency of the FMCW generated by a preceding circuit (i.e., the phase-locked loop) is effectively reduced.

In some examples, the above-mentioned frequency multiplier may be manufactured using a manufacturing process of a short channel device. For example, a 40 nm process or below (e.g., the 40 nm process, a 22 nm process, etc.) is used, so that at least part of devices in a circuit for generating oscillating waves and a circuit for amplifying radio frequency signals and the like has a capability of processing radio frequency signals.

FIG. 1 is a schematic diagram of a structure of a frequency multiplier according to an embodiment of the present application. As shown in FIG. 1, the frequency multiplier 10 includes a signal generator 11 and a third harmonic amplifier 12; wherein:

The signal generator 11 is configured to receive an FMCW signal and output a square wave signal at a frequency same as a frequency of the FMCW signal.

The square wave signal may be decomposed into a fundamental wave, a third harmonic wave and a higher order odd harmonic wave. Therefore, a signal generator may be used, instead of an oscillator, as a generating device for a third harmonic component. Furthermore, compared with other square wave signals (such as ramp signals, sinusoidal signals, etc.) generated by some oscillators, a proportion of the third harmonic component in the square wave signal is higher than a proportion of a third harmonic component in the other square wave signals.

Figure 2A:
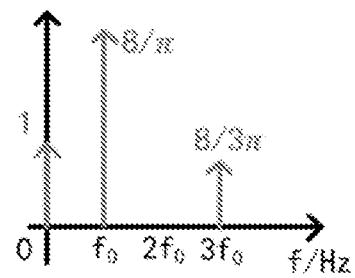
FIG. 2A is a schematic diagram of frequency domain distribution of a square wave signal after a Fast Fourier Transform.
Figure 2B:
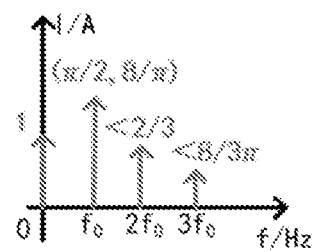
FIG. 2B is a schematic diagram of frequency domain distribution of an oscillation signal after a Fast Fourier Transform.

FIG. 2A and FIG. 2B are schematic diagrams of frequency domain distributions of a square wave signal and a certain ramp signal after a Fast Fourier Transform (FFT for short), respectively. As shown in FIG. 2A, a ratio of a third harmonic component to a direct current component in the square wave signal is $8/3\ \pi$. As shown in FIG. 2B, a ratio of a third harmonic component to a direct current component in an oscillation signal is less than $8/3\ \pi$. It can be seen from the above-mentioned comparison that the third harmonic component can be generated more efficiently by using the signal generator 11.

Furthermore, quantities of input terminals and output terminals of the signal generator 11 may vary according to different application scenarios.

Specifically, the signal generator 11 has two input terminals and one output terminal, as a signal generator with differential inputs and a single output. Alternatively, the signal generator has one input terminal and one output terminal, as a signal generator with a single input and single output. Alternatively, the signal generator has two inputs and two outputs, as a signal generator with differential inputs and a differential output.

The above-mentioned differential inputs mean that the signal generator 11 receives two channels of FMCW signals that constitute differential signals. That is, the two channels of FMCW signals have same amplitude and inverse phases.

Taking the signal generator 11 as a square wave generator as an example, the above-mentioned differential outputs mean that the square wave generator outputs two channels of square wave signals, wherein the two channels of square wave signals constitute differential signals, that is, the two channels of square wave signals have the same amplitude and inverse phases.

The third harmonic amplifier 12 is coupled to the signal generator 11 and is configured to amplify the third harmonic wave in the square wave signal and output a frequency-tripled FMCW signal.

When the received square wave signal is differential signals, the third harmonic amplifier 12 may be a differential amplifier for amplifying the third harmonic component in the square wave signals corresponding to the differential signals and outputting an FMCW signal of a frequency-tripled differential signal.

The differential amplifier is an amplifier that amplifies a voltage difference between two input signals by a fixed gain.

Third harmonic component that may be extracted by the third harmonic amplifier 12 is more since the proportion of the third harmonic component in the square wave signal is higher than a proportion of the third harmonic component in some examples when the oscillator is used to generate the third harmonic component, thereby improving a generation efficiency of the frequency-tripled FMCW signal.

The third harmonic amplifier may be a radio frequency amplifier that amplifies the signal, thereby amplifying the third harmonic wave effectively and suppressing other clutter. Compared with an oscillator injection approach, an operation bandwidth of the radio frequency amplifier is wider and independent of an injection locking range, and its performance is more stable as the PVT varies.

In a structure shown in FIG. 1, the signal generator is configured to generate a square wave signal corresponding to the FMCW signal, and a third harmonic amplifier is used to amplify the third harmonic component of the square wave signal to obtain a frequency-tripled FMCW signal, thus achieving the purpose of generating a high frequency signal. In addition, third harmonic component extracted by the third harmonic amplifier 12 is more since the proportion of the third harmonic component in the square wave signal is higher than the proportion of the third harmonic component when the oscillator is used to generate the third harmonic component, thereby improving the generation efficiency of the frequency-tripled FMCW signal.

The frequency multiplier provided in the embodiments of the present application is described below.

Figure 3A:
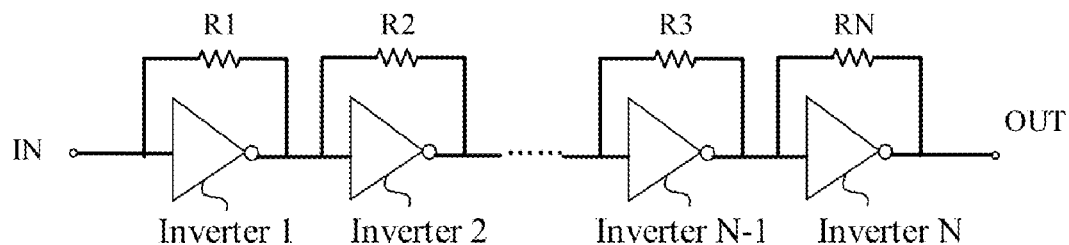
FIG. 3A is a schematic diagram of a signal generator in a frequency multiplier.

FIG. 3A is a schematic diagram of a signal generator 11 in the frequency multiplier 10 shown in FIG. 1. As shown in FIG. 3A, the signal generator 11 includes N inverter circuits cascaded, where N is an integer greater than or equal to 2.

Specifically, the N inverter circuits are connected in a cascade manner, wherein an input terminal of a first inverter circuit is configured to receive an FMCW signal, and an output terminal of an N-th inverter circuit is configured to output a square wave signal. An input terminal of an n-th inverter circuit is connected to an output terminal of an (n−1)-th inverter circuit, and an n-th output terminal is connected to an input terminal of an (n+1)-th inverter circuit, where n=2, 3, . . . , N−1.

At least part of the inverter circuits includes an inverter and a resistor. The resistor is connected between an input terminal and an output terminal of a corresponding inverter. A channel of FMCW signals passes through N cascaded inverter circuits to form a channel of square wave signals.

Specifically, the inverter has a corresponding resistor, wherein a terminal of the resistor is connected to an input terminal of the inverter and the other terminal of the resistor is connected to an output terminal of the inverter.

Two terminals of the inverter are connected to the resistor in parallel, so that a feedback loop is provided for the inverter. The resistor reverses an output signal by 180 degrees and then feeds back to the input terminal of the inverter, thus forming a negative feedback amplifier circuit.

Figure 3B:
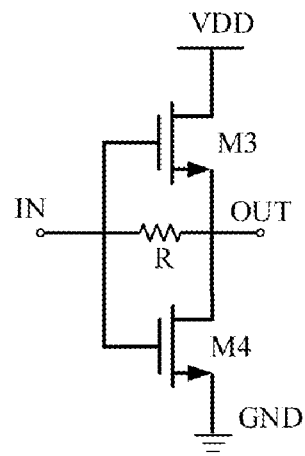
FIG. 3B is a schematic diagram of an inverter circuit.

FIG. 3B is a schematic diagram of connection of the inverter and the resistor in FIG. 3A. As shown in FIG. 3B, at least one of the N inverter circuits is a self-biased inverter circuit.

The self-biased inverter circuit includes a third switching transistor M3 and a fourth switching transistor M4. A control terminal of the third switching transistor M3 is connected to a control terminal of the fourth switching transistor M4. An input terminal of the third switching transistor M3 is connected to a system voltage VDD. An input terminal of the fourth switching transistor M4 is connected to an output terminal of the third switching transistor M3, and an output terminal of the fourth switching transistor M4 is grounded.

A first connection point is provided between the control terminal of the third switching transistor M3 and the control terminal of the fourth switching transistor M4, as an input terminal IN for receiving an input signal. A second connection point is provided between the output terminal of the third switching transistor M3 and the input terminal of the fourth switching transistor M4, as an output terminal OUT for outputting the processed signal.

The resistor is denoted as R in FIGS. 3A and 3B, and a terminal of the resistor is connected to the input IN, and the other terminal of the resistor is connected to the output terminal OUT.

At least one of the third switching transistor M3 and the fourth switching transistor M4 is a MOS transistor or a CMOS transistor. Similarly, at least one of a first switching transistor M1, a second switching transistor M2, a fifth switching transistor M5 and a sixth switching transistor M6 mentioned in the below is a MOS transistor or a CMOS transistor.

By selecting one or more of the N cascaded inverter circuits as the self-biased inverter circuits, it is ensured that the FMCW signal can be converted into a square wave signal, and the inverter circuits may also be placed at a proper direct current bias point, thus avoiding an extreme low signal gain output by the inverter circuits.

Figure 4A:
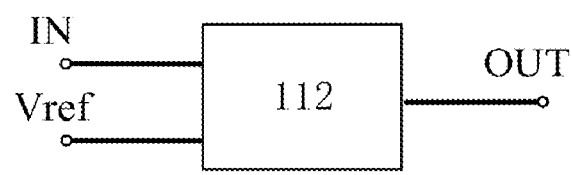
FIG. 4A is a schematic diagram of a signal generator in a frequency multiplier.

FIG. 4A is yet another schematic diagram of a signal generator 11 in the frequency multiplier 10 shown in FIG. 1. As shown in FIG. 4A, the signal generator 11 includes a comparator circuit 112, wherein an output terminal of the comparator circuit 112 is configured to output a square wave signal.

Taking a case in which the comparator circuit 112 receives a single channel of FMCW signals as an example, one input terminal of the comparator circuit 112 receives the FMCW signal, and another input terminal of the comparator circuit 112 receives a reference signal (such as at 0 v voltage). The comparator circuit 112 performs signal flip by comparing voltages of the electrical signals of the two input terminals to output a square wave signal of the FMCW signal. The comparator circuit 112 includes comparators in a plurality of stages, and may output the square wave signal of the FMCW signal.

Comparing the structure shown in FIG. 4A with the structure shown in FIG. 3A, the structure shown in FIG. 4A needs a smaller quantity of components and is convenient for layout and routing on a circuit board.

Figure 4B:
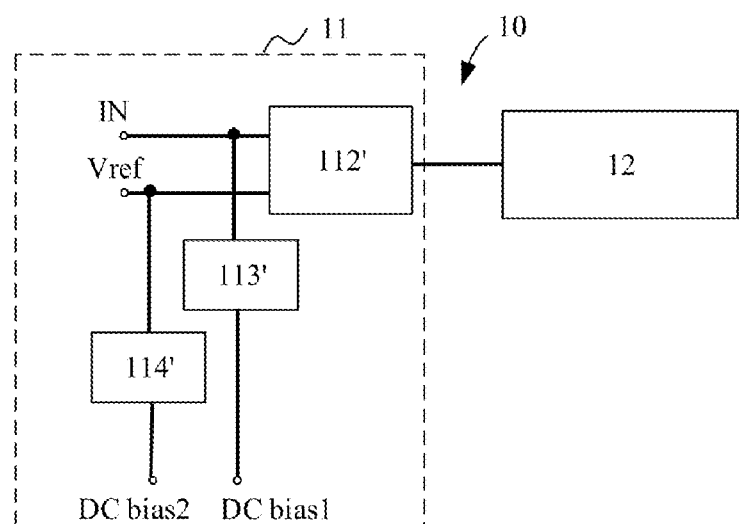
FIG. 4B is another schematic diagram of a signal generator in a frequency multiplier.

FIG. 4B is another yet schematic diagram of a comparator circuit in a frequency multiplier. As shown in FIG. 4B, an input terminal of a comparator circuit 112' is configured to receive an FMCW signal, another input terminal of the comparator is connected to a reference voltage Vref, wherein a size of the reference voltage Vref may be a direct current level of the FMCW signal, and an output terminal of the comparator is configured to output the square wave signal.

One terminal of a first impedance device 113' is connected with one input terminal of the comparator circuit 112', and another terminal of the first impedance device 113' is connected with a first DC bias voltage (DC bias1), so as to adjust a voltage value of the input terminal. One terminal of a second impedance device 114' is connected with the other input terminal of the comparator circuit 112', and the another terminal of the second impedance device 114' is connected with a second DC bias voltage (DC bias2), so as to adjust a voltage value of the other input terminal.

The first DC bias voltage (DC bias1) and the second DC bias voltage (DC bias2) may be equal, or one of them is greater than the other. Furthermore, one of the first DC bias voltage (DC Bias 1) and the second DC bias voltage (DC Bias 2) may be multiple of the other one. The first impedance device 113' and the second impedance device 114' may be resistors.

The first impedance device 113' and the second impedance device 114' perform voltage adjustment to ensure that the square wave signal output by the comparator circuit 112' is a standard square wave, thereby avoiding radians of upper and lower edges of the output square wave signal and ensuring integrality of the square wave signal.

Figure 4C:
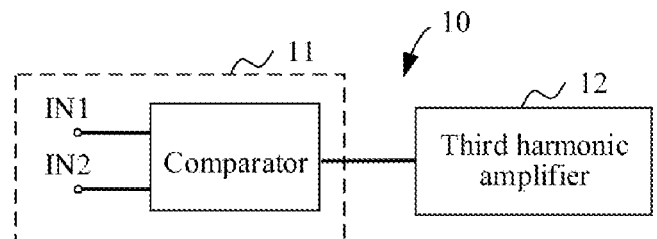
FIG. 4C is yet another schematic diagram of a signal generator in a frequency multiplier.

FIG. 4C is a second schematic diagram of the comparator circuit in the frequency multiplier 10. As shown in FIG. 4C, two input terminals of the comparator circuit receive one channel of the two differential channels of FMCW signals, respectively. The output terminal of the comparator circuit is configured to output the square wave signal.

Figure 5A:
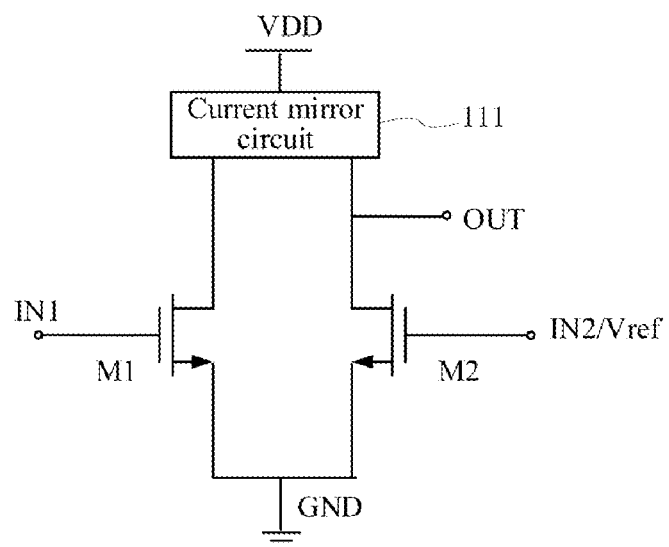
FIG. 5A is a still yet another schematic diagram of a signal generator in a frequency multiplier.

FIG. 5A is yet another schematic diagram of a signal generator in the frequency multiplier 10. As shown in FIG. 5A, by using a characteristic of a current mirror that provides a mirror current, the signal generator 11 generates a square wave signal with a suitable fluctuation range by adjusting turning on and turning off of different current paths of the current mirror. Therefore, the signal generator 11 includes a current mirror circuit 111, a first switching transistor M1 and a second switching transistor M2. The current mirror circuit 111 is connected to a first current transmission path and a second current transmission path, so that a first direct current bias signal transmitted by the first current transmission path and a second direct current bias signal transmitted by the second current transmission path are in a preset current proportional relationship. The first switching transistor M1 is connected to the first current transmission path, and a control terminal of the first switching transistor M1 is configured to receive a channel of FMCW signals. The second switching transistor M2 is connected to the second current transmission path, and a control terminal of the second switching transistor M2 receives a reference signal or another channel of FMCW signals. The second current transmission path is provided with an output terminal to output the square wave signal.

Taking the FMCW signal being a single channel of signals as an example, the second switching transistor M2 is connected to a reference voltage Vref to make the second switching transistor M2 be turned off. When the first switching transistor M1 is turned on under the control of the FMCW signal, the output terminal OUT outputs a direct current signal, a current value of the direct current signal is determined according to the preset current proportional relationship and a current value flowing through the first switching transistor M1. When the first switching transistor M1 is turning off, because the first current transmission path where the first switching transistor M1 is located is turning off and there is no current, the second current transmission path where the output terminal OUT is located has also no current. Thus, a square wave signal with a same frequency as the frequency of the FMCW signal is formed.

Taking the FMCW signal as differential signals as an example, the first switching transistor M1 is connected with one of the differential signals (e.g. an FMCW signal 1), the second switching transistor M2 is connected with the other one of the differential signals (e.g. an FMCW signal 2).

The differential signals have characteristics of an inverse phase and an equal amplitude, and the first switching transistor M1 and the second switching transistor M2 are switching transistors manufactured by a same process. Thus, when the first switching transistor M1 is turned on under the control of the FMCW signal 1 and the second switching transistor M2 is turned off under the control of the FMCW signal 2, a current is transmitted in each of the first current transmission path and the second current transmission path of the current mirror circuit, so that a current is output at the output terminal OUT. When the first switching transistor M1 is turned off under the control of the FMCW signal 1 and the second switching transistor M2 is turned on under the control of the FMCW signal 2, no current is transmitted in the first current transmission path or the second current transmission path of the current mirror circuit, so that no current is output at the output terminal OUT. Thereby, a square wave signal with a same frequency as the frequency of the FMCW signal is formed.

In an embodiment of the present application, the current mirror functions to replicate or multiply the current signal, wherein a multiple may be greater than 1 or less than 1. That is, a current signal output from one terminal of the current mirror is replicated or multiplied as another current signal output from the other terminal. Another current signal obtained by replication is equal to the current signal used. If a multiple of a multiplication operation is m, another current signal obtained by multiplication is m times of the current signal used, where m is a value greater than 0 and not equal to 1.

Figure 5B:
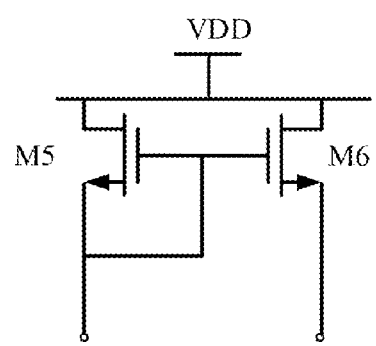
FIG. 5B is a schematic diagram of the current mirror in the signal generator shown in FIG. 5A.

The current mirror circuit may be a current mirror circuit formed by a CMOS transistor or a PMOS transistor. For example, FIG. 5B is a schematic diagram of the current mirror in the signal generator 11 shown in FIG. 5A. As shown in FIG. 5B, the current mirror circuit includes a fifth switching transistor M5 and a sixth switching transistor M6; wherein:

Both of an input terminal of the fifth switching transistor M5 and an input terminal of the sixth switching transistor M6 are connected with the power supply voltage VDD. A control terminal of the fifth switching transistor M5 is connected with the control terminal of the sixth switching transistor M6, a connection point is provided between the control terminal of the fifth switching transistor M5 and the control terminal of the sixth switching transistor M6, another connection point is provided at an output terminal of the fifth switching transistor M5, and the two connection points are connected.

The output terminal of the fifth switching transistor M5 serves as a first output terminal of the current mirror, and an output terminal of the sixth switching transistor serves as a second output terminal of the current mirror.

Taking advantage of a characteristic of the current mirror, the first direct current bias voltage (DC bias1) and the second direct current bias voltage (DC bias2) may be equal, or one of the first direct current bias voltage (DC bias1) and the second direct current bias voltage (DC bias2) may be multiple of the other one.

Figure 6A:
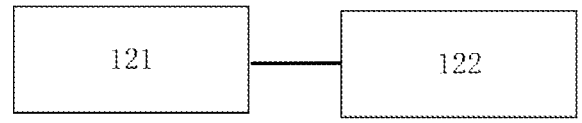
FIG. 6A is a schematic diagram of a third harmonic amplifier in a frequency multiplier.

FIG. 6A is a schematic diagram of the third harmonic amplifier 12 in the frequency multiplier 10. As shown in FIG. 6A, the third harmonic amplifier 12 includes a radio frequency amplifier 121 and a filter 122.

The Filter 122 is connected with the radio frequency amplifier 121 and is configured to filter a signal amplified by the radio frequency amplifier 121.

Specifically, the filter 122 may filter out interference signals (e.g. a fundamental wave or a higher order harmonic component) mixed with a third harmonic component, so as to reduce interference signals in the amplified signal.

Figure 6B:
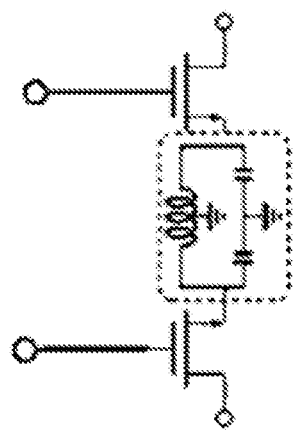
FIG. 6B is another schematic diagram of a third harmonic amplifier.

FIG. 6B is another schematic diagram of the third harmonic amplifier 12. As shown in FIG. 6B, the filter is a notch filter, with reference to a device in a dashed box in FIG. 6B. A resonant frequency of the notch filter is a frequency of an interference signal and is used to filter out the interference signal.

Figure 7:
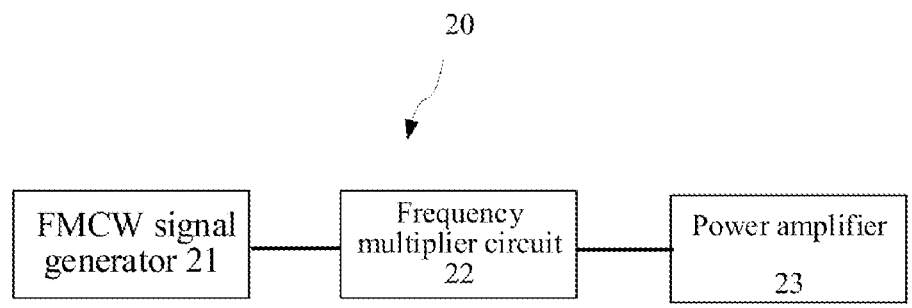
FIG. 7 is a schematic diagram of a signal transmitter according to an embodiment of the present application.

FIG. 7 is a schematic diagram of a signal transmitter according to an embodiment of the present application. As shown in FIG. 7, the signal transmitter 20 includes an FMCW signal generator 21, a frequency multiplier circuit 22 including any frequency multiplier described above, and a power amplifier 23, wherein:

The FMCW signal generator 21 is configured to generate an FMCW signal under control of a frequency division adjustment signal.

The FMCW signal generator may be any kind of generator which can generate an FMCW signal.

For example, the FMCW signal generator 21 is a phase-locked loop that generates an FMCW signal based on the frequency division adjustment signal. The phase-locked loop includes a voltage controlled oscillator, a charge pump, a phase frequency detector, a frequency divider and a modulator. The frequency phase detector receives a reference clock signal and a frequency division signal, and is connected to the charge pump. The charge bump is connected to the voltage controlled oscillator to provide a control voltage. The voltage controlled oscillator is controlled by the control voltage to output a square wave signal with an adjustable frequency. The frequency divider is connected between the voltage controlled oscillator and the frequency phase detector to divide a frequency of the square wave signal and output the frequency division signal. The frequency phase detector detects the reference clock signal and the frequency division signal, and outputs a representation signal (i.e. up and down signal) corresponding to a sequence of respective jump edges. The charge pump adjusts the output control voltage according to the representation signal. The voltage controlled oscillator changes the frequency of the output square wave signal according to an amplitude change of the received control voltage. When the frequency of the square wave signal is a constant frequency, the control voltage is stable.

In order to output the FMCW signal, the modulator outputs the frequency division adjustment signal according to a preset frequency change linearity, so that the frequency divider adjusts the frequency division signal in a loop for the square wave signal by changing a frequency division ratio, so that the output square wave signal is the FMCW signal.

The frequency multiplier circuit 22 is coupled to the FMCW signal generator 21, and is configured to convert the FMCW signal in a frequency into a radio frequency FMCW signal in a millimeter wave frequency band by using the frequency multiplier therein. According to the frequency band of the FMCW signal, in some examples, the frequency multiplier circuit 22 includes only a frequency tripler in the above examples.

Based on the signal generator, the frequency multiplier may generate a third harmonic component, which improves an output efficiency of the frequency-tripled FMCW signal. The third harmonic component is amplified by the radio frequency amplifier, which reduces an interference to the frequency-tripled FMCW signal and improves a signal-to-noise ratio of an output signal of the frequency multiplier.

In another example, the frequency multiplier circuit 22 includes cascaded frequency multipliers, wherein the cascaded frequency multipliers include the frequency tripler in the above example. For example, the frequency multiplier circuit 22 further includes one or at least two frequency doublers cascaded with the frequency multipliers, such that the frequency multiplier circuit amplifies a frequency of the FMCW signal by six times or more.

Specifically, an input terminal of at least one frequency doubler may be connected with an output terminal of the frequency multiplier, so as to perform frequency amplification on an FMCW signal of which the frequency has been amplified by 3 times. Or, an output terminal of the at least one frequency doubler may be connected with an input terminal of the frequency doubler, so as to output an FMCW signal of which the frequency has been amplified by two times, so the frequency multiplier may continue to amplify the frequency of the FMCW signal of which the frequency has been amplified by two times.

On the premise that the frequency of the radio frequency FMCW signal is preset, a purpose of increasing a frequency multiplying capability of the frequency multiplier circuit can be achieved by providing one or more frequency multipliers, thereby reducing the frequency of the FMWC signal output by the FMCW signal generator.

Since the frequency of the FMWC signal output by the FMCW signal generator 21 is reduced, a phase noise in the FMWC signal is reduced correspondingly, so that a phase random change carried in the radio frequency FMWC is further reduced. Therefore, an interference signal generated due to the phase random change during transmission of the radio frequency FMWC signal is reduced.

The power amplifier 23 is configured to perform power amplification on the radio frequency FMCW signal and output, so as to meet a radiation range of a detection signal wave. The power amplifier includes one or more common-source amplifiers and the like. For example, the power amplifier contains a plurality of cascaded common-source amplifiers.

Figure 8:
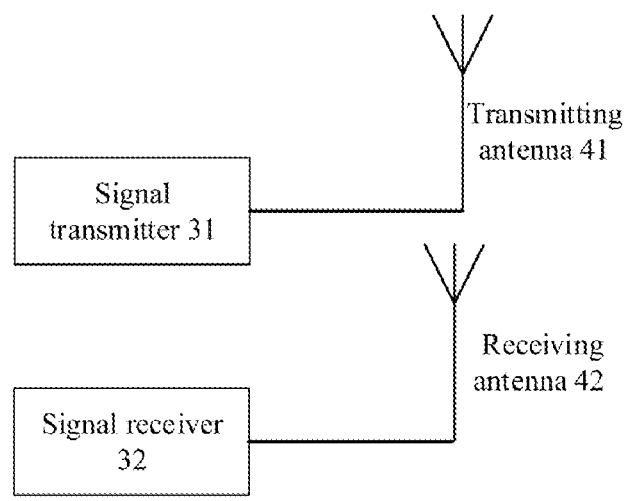
FIG. 8 is a schematic diagram of a radar chip provided in an embodiment of the present application.

FIG. 8 is a schematic diagram of a radar sensor according to an embodiment of the present application. As shown in FIG. 8, the radar sensor includes: a transmitting antenna 41 configured to convert a received radio frequency FMCW signal into a detection signal wave, to radiate to a free space; and a receiving antenna 42 configured to convert an echo signal wave into a radio frequency received signal, wherein the detection signal wave is reflected by an object to form the echo signal wave; the above-mentioned signal transmitter 31 connected with the transmitting antenna 41, and configured to feed a generated radio frequency FMCW signal to the transmitting antenna; and a signal receiver 32 connected with the receiving antenna 42, and configured to process the radio frequency received signal into a baseband digital signal using the radio frequency transmitted signal, and output the baseband digital signal.

The circuit modules in the radar sensor may be integrated in a same radar chip, or the antennas may be externally placed on a high-frequency wiring board where the radar chip is located.

A phase error and a bandwidth linearity of the radio frequency FMCW signal output by the signal transmitter of the present application are improved great, so that a detection accuracy of the radar sensor is improved.

Furthermore, the signal transmitter may also amplify a frequency of the FMCW signal by using a frequency multiplier manufactured in a process below 40 nm, which can support processing of FMCW signals in a range of 10 GHz to 25 GHz, and can be suitable for usage requirements of millimeter wave radar chips.

Furthermore, by improving a multiplication capability of the frequency multiplier circuit in the signal transmitter, a requirement on an output frequency of the FMCW signal generator can be reduced, the frequency of the FMCW signal output by the FMCW signal generator can be controlled to become lower, so that the phase noise of the FMCW signal is reduced, and the phase random change carried in the radio frequency FMCW signal transmitted by the transmitting antenna is reduced. Therefore, an interference signal in the echo signal wave received by the signal receiver through the receiving antenna is reduced, and a signal-to-noise ratio of the echo signal wave is improved.

In an embodiment, the present application further provides an electronic device including a device body, and a radar sensor disposed on the device body, as in the above embodiments; wherein the radar sensor is configured for target detection.

In an embodiment of the present application, the radar sensor may be disposed outside the device body. In another embodiment of the present application, the radar sensor may also be disposed inside the device body. In some other embodiments of the present application, a radio device may also be partially disposed inside the device body, and a part of the radar sensor may be disposed outside the device body, which is not limited in the embodiments of the present application, and depends on appropriate.

It should be noted that the radio sensor can perform functions such as target detection, by transmitting and receiving electromagnetic signals based on the FMCW signal, so as to provide detection of target information and/or communication information to the device body, thereby aiding to or even controlling an operation of the device body.

In an alternative embodiment, the device body may be components and products applied to fields such as intelligent residences, transportation, smart homes, consumer electronics, monitoring, industrial automation, in-cabin detection, and health care. For example, the device body may be a smart transportation device (such as an automobile, bicycle, motorcycle, ship, subway, train, etc.), a security device (such as a camera), a liquid level/flow rate detection device, a smart wearable device (such as a bracelet, glasses, etc.), a smart home device (such as a sweeping robot, a door lock, a television, an air conditioner, a smart light, etc.), various communication devices (such as a mobile phone, a tablet computer, etc.), as well as a road gate, a smart traffic light, a smart sign, a traffic camera and various industrial mechanical arms (or robots), etc. The device body may be various instruments for detecting vital signs parameters and various devices equipped with the instruments, such as a device for detection in automobile cabins, a device for indoor personnel monitoring, an intelligent medical device, a consumer electronic device, etc.

In yet another alternative embodiment, when the device body is applied to the Advanced Driving Assistance System (ADAS for short), the radio device (such as a millimeter wave radar) as an on-board sensor can provide various functional safety guarantees for the ADAS system, such as Automatic Brake Assistance (AEB for short), Blind Spot Detection (BSD for short), Lane Change Assist (LCA for short), Rear Cross Traffic Alert (RCTA for short), etc.

Taking a vehicle provided with the radar sensor as an example, the vehicle further includes a vehicle shell, a vehicle drive system, and a vehicle control system.

At least one assembly hole or fence is provided on the vehicle shell to assemble the radar sensor. Taking the assembly hole as an example, the assembly hole is disposed at one or more positions on the vehicle shell according to a requirement of the vehicle control system on measurement information provided by the radar sensor. For example, there are a plurality of assembly holes disposed at four body angle positions of the vehicle shell, and/or a rearview mirror position, etc. The assembly holes may also be disposed directly in front of and behind the vehicle, and/or at a door position, etc.

The vehicle drive system is configured to drive the whole vehicle to move, such as forward, backward, turning and the like. The drive system includes, for example, an engine, a transmission mechanism, wheels and the like.

The vehicle control system is connected with the radar sensor, and is configured to provide warning information and/or control the vehicle drive system to execute safety emergency operation according to the measurement information.

Herein, the vehicle control system includes a radar warning device of the vehicle. The vehicle control system may even include an automatic driving assistance system. Taking the radar sensor connected with the radar warning device as an example, the radar sensor is arranged at a body angle position behind the vehicle, and the radar sensor is configured to provide obstacle information within a range of approximately 90 degrees from a lateral side of the vehicle to a rear side of the vehicle to the radar warning device. In a process of reversing the vehicle, when determining that there is an obstacle in a corresponding range according to the measurement information provided by the radar sensor, the radar warning device provides corresponding warning information, such as buzzer sound, image and so on. Taking the radar sensor connected with the automatic driving assistance system as an example, the radar sensor is arranged at a body angle position of the back of the vehicle, and the radar sensor is configured to provide obstacle information within a range of approximately 90 degrees from the lateral side of the vehicle to the rear side of the vehicle to the automatic driving assistance system. In the process of reversing the vehicle, when determining that there is an obstacle in the corresponding range according to the measurement information provided by the radar sensor, the automatic driving assistance system controls the vehicle to slow down or even stop.

The various technical features of the above-mentioned embodiments may be arbitrarily combined, and for the sake of brevity of description, not all possible combinations of the various technical features of the above-described embodiments have been described; however, as long as there is no conflict in these combinations of technical features, they should be considered to be within the scope of the present specification.

It should be noted that the above are only preferred embodiments of the present application and the technical principles employed. It should be understood by those skilled in the art that the present application is not limited to specific embodiments described herein and that various significant changes, readjustments and substitutions can be made to those skilled in the art without departing from the protection scope of the present application. Therefore, although the present application has been described in more detail by the above embodiments, the present application is not limited to the above embodiments, but may include more other equivalent embodiments without departing from the concept of the present application, and the scope of the present application is determined by the scope of the appended claims.

The invention claimed is:

1. A signal transceiver, comprising a Frequency-Modulated Continuous Wave (FMCW) signal generator, a frequency multiplier circuit comprising a frequency multiplier, and a power amplifier; wherein,
the FMCW signal generator is configured to generate an FMCW signal under control of a frequency division adjustment signal;
the frequency multiplier circuit is coupled to the FMCW signal generator, and configured to convert a frequency of the FMCW signal into a radio frequency band by using the frequency multiplier, to obtain a radio frequency FMCW signal;
the power amplifier is coupled with the frequency multiplier circuit, and configured to perform power amplification on the radio frequency FMCW signal and output a radio frequency transmitted signal;
wherein the frequency multiplier comprises:
a signal generator, configured to receive the FMCW signal and output a square wave signal at a frequency same as a frequency of the FMCW signal; and
a third harmonic amplifier, coupled to the signal generator and configured to amplify a third harmonic wave in the square wave signal and output a frequency-tripled FMCW signal.

2. The signal transceiver of claim 1, wherein the signal generator comprises a signal generator with differential inputs and a single output, or a signal generator with a single input and a single output, or a signal generator with differential inputs and differential outputs.

3. The signal transceiver of claim 1, wherein the signal generator comprises:
N cascaded inverter circuits; wherein at least part of the inverter circuits comprises an inverter and a resistor; the resistor is connected between an input terminal and an output terminal of a corresponding inverter; a channel of FMCW signals passes through the N cascaded inverter circuits to form a channel of square wave signals; wherein N is an integer greater than or equal to 2.

4. The signal transceiver of claim 3, wherein at least one of the N inverter circuits is a self-biased inverter.

5. The signal transceiver of claim 1, wherein the signal generator comprises a comparator circuit; wherein
one of two input terminals of the comparator circuit receives a single channel of FMCW signals and the other one of the two input terminals of the comparator circuit receives a reference signal; or, two input terminals of the comparator circuit receive one channel of two differential channels of FMCW signals, respectively; and
an output terminal of the comparator circuit is configured to output the square wave signal.

6. The signal transceiver of claim 1, wherein the signal generator comprises a current mirror circuit, a first switching transistor and a second switching transistor; wherein
the current mirror circuit is connected to a first current transmission path and a second current transmission path, to enable a first direct current bias signal transmitted on the first current transmission path and a second direct current bias signal transmitted on the second current transmission path are in a preset current proportional relationship; the first switching transistor is connected to the first current transmission path, and a control terminal of the first switching transistor is configured to receive a channel of FMCW signals; and the second switching transistor is connected to the second current transmission path, and a control terminal of the second switching transistor receives a reference signal or another channel of FMCW signals;
wherein the second current transmission path is provided with an output terminal to output the square wave signal.

7. The signal transceiver of claim 1, wherein the third harmonic amplifier comprises a radio frequency amplifier.

8. The signal transceiver of claim 1, wherein the frequency multiplier further comprises:
a filter that is connected with the third harmonic amplifier and is configured to filter the frequency-tripled FMCW signal after amplification performed by the third harmonic amplifier.

9. The signal transceiver of claim 1, wherein the signal generator is manufactured using a short channel device process.

10. The signal transceiver of claim 4, wherein the self-biased inverter circuit comprises a third switching transistor and a fourth switching transistor, a control terminal of the third switching transistor is connected to a control terminal of the fourth switching transistor, an input terminal of the third switching transistor is connected to a system voltage VDD, an input terminal of the fourth switching transistor is connected to an output terminal of the third switching transistor, and an output terminal of the fourth switching transistor is grounded.

11. The signal transceiver of claim 6, wherein the current mirror circuit comprises a fifth switching transistor and a sixth switching transistor, both of an input terminal of the fifth switching transistor and an input terminal of the sixth switching transistor are connected with a power supply voltage VDD, a control terminal of the fifth switching transistor is connected with the control terminal of the sixth switching transistor, a connection point is provided between the control terminal of the fifth switching transistor and the control terminal of the sixth switching transistor, another connection point is provided at an output terminal of the fifth switching transistor, and the two connection points are connected.

12. The signal transceiver of claim 8, wherein the filter is a notch filter.

13. The signal transceiver of claim 12, wherein a resonant frequency of the notch filter is a frequency of an interference signal.

14. The signal transceiver of claim 1, wherein the frequency multiplier circuit further comprises a frequency doubler cascaded with the frequency multiplier.

15. The signal transceiver of claim 1, wherein the frequency multiplier circuit comprises cascaded frequency multipliers, the cascaded frequency multipliers comprise a frequency tripler.

16. A radar sensor, comprising:
a transmitting antenna, configured to convert a received radio frequency FMCW signal into a detection signal wave, to radiate to a free space;
a receiving antenna, configured to convert an echo signal wave into a radio frequency received signal, wherein the detection signal wave is reflected by an object to form the echo signal wave; and the signal transceiver of claim 1, connected with the transmitting antenna, and is configured to feed a generated radio frequency FMCW signal to the transmitting antenna;

wherein the signal transceiver is further connected with the receiving antenna, and is configured to process the radio frequency received signal into a baseband digital signal using the radio frequency transmitted signal, and output the baseband digital signal.

17. The signal transceiver of claim 1, further comprising: a signal receiver configured to process a radio frequency received signal into a baseband digital signal using the radio frequency transmitted signal, and output the baseband digital signal.

* * * * *